US010379180B2

(12) United States Patent
Biber et al.

(10) Patent No.: US 10,379,180 B2
(45) Date of Patent: Aug. 13, 2019

(54) TRANSMISSION ANTENNA APPARATUS AND MAGNETIC RESONANCE IMAGING DEVICE

(71) Applicants: Stephan Biber, Erlangen (DE); Helmut Greim, Adelsdorf (DE); Klaus Huber, Effeltrich (DE); Sebastian Martius, Forchheim (DE); Johanna Dorothee Schöpfer, Erlangen (DE)

(72) Inventors: Stephan Biber, Erlangen (DE); Helmut Greim, Adelsdorf (DE); Klaus Huber, Effeltrich (DE); Sebastian Martius, Forchheim (DE); Johanna Dorothee Schöpfer, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 833 days.

(21) Appl. No.: 14/539,782

(22) Filed: Nov. 12, 2014

(65) Prior Publication Data
US 2015/0130467 A1 May 14, 2015

(30) Foreign Application Priority Data

Nov. 13, 2013 (DE) .................. 10 2013 223 120
Apr. 24, 2014 (DE) .................. 10 2014 207 731

(51) Int. Cl.
*G01V 3/00* (2006.01)
*G01R 33/341* (2006.01)
*G01R 33/3415* (2006.01)

(52) U.S. Cl.
CPC ........ *G01R 33/341* (2013.01); *G01R 33/3415* (2013.01)

(58) Field of Classification Search
CPC ............ G01R 33/3415; G01R 33/3664; G01R 33/34046; G01R 33/34076; G01R 33/34092; G01R 33/365; G01R 33/3678; H03J 2200/06; H03J 2200/10; H03J 3/20; H03J 7/04; H04B 1/18
See application file for complete search history.

(56) References Cited

U.S. PATENT DOCUMENTS

| 4,816,765 | A  | 3/1989  | Boskamp        |
| 7,924,009 | B2 | 4/2011  | Bosshard et al. |
| 2006/0255804 | A1 | 11/2006 | Chu et al.     |
| 2009/0212774 | A1 | 8/2009  | Bosshard et al. |
| 2012/0200294 | A1 | 8/2012  | Lazar          |

(Continued)

FOREIGN PATENT DOCUMENTS

| DE | 102006022286 A1 | 11/2006 |
| DE | 102008011144 A1 | 9/2009  |

(Continued)

OTHER PUBLICATIONS

German Search Report for German Application No. 10 2014 207 731.1, dated Feb. 11, 2015, with English Translation.

*Primary Examiner* — Rodney E Fuller
(74) *Attorney, Agent, or Firm* — Lempia Summerfield Katz LLC

(57) ABSTRACT

The transmission antenna apparatus is configured for emitting transmission magnetic fields in magnetic resonance imaging devices and includes one or more flat antennas. A magnetic resonance imaging device includes such a transmission antenna apparatus.

17 Claims, 4 Drawing Sheets

(56) References Cited

U.S. PATENT DOCUMENTS

| | | |
|---|---|---|
| 2014/0055136 A1 | 2/2014 | Leussler et al. |
| 2015/0025362 A1 | 1/2015 | Biber et al. |
| 2016/0131728 A1* | 5/2016 | Biber ................. G01R 33/3642 324/309 |

FOREIGN PATENT DOCUMENTS

| | | |
|---|---|---|
| DE | 102010033330 A1 | 2/2012 |
| DE | 112012001772 T5 | 3/2014 |
| EP | 0274773 B1 | 5/1991 |

* cited by examiner

TRANSMISSION ANTENNA APPARATUS AND MAGNETIC RESONANCE IMAGING DEVICE

This application claims the benefit of DE 10 2013 223 120.2, filed on Nov. 13, 2013, and DE 10 2014 207 731.1, filed Apr. 24, 2014, the entire contents of which are hereby incorporated by reference in their entirety.

BACKGROUND

The present embodiments relate to a transmission antenna apparatus and a magnetic resonance imaging device.

Circularly polarized transmission magnetic fields are used in magnetic resonance imaging for exciting magnetic resonances. Magnetic resonance imaging devices may include whole-body antennas. However, the magnetic resonance imaging devices generate the circularly polarized transmission magnetic field not only in the current body volume intended to be examined by MRI but also in a substantially larger volume region of the body. The overall power provided for this is therefore substantially higher than the power would be in the case of a locally delimited excitation. In this context, the total power dissipation converted in the body is also higher than would actually be necessary.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a transmission antenna apparatus that is improved over the prior art is provided. For example, the transmission antenna apparatus may be configured to generate a locally delimited transmission magnetic field. In another example, a magnetic resonance imaging device in which a transmission antenna apparatus is configured for generating a locally delimited transmission magnetic field is provided.

The transmission antenna apparatus according to one or more of the present embodiments is configured for emitting transmission magnetic fields in magnetic resonance imaging devices. The transmission antenna apparatus includes one or more flat antennas. Consequently, the flat antennas of the transmission antenna apparatus according to one or more of the present embodiments may be configured in a particularly space-saving manner. For example, the flat antennas may be integrated into a patient couch of a magnetic resonance imaging device. In this manner, the flat antennas of the transmission antenna device according to one or more of the present embodiments do not take up any additional space.

Advantageously, a locally delimited transmission magnetic field may be generated simply by the transmission antenna apparatus according to one or more of the present embodiments (e.g., in accordance with the developments explained below).

In one embodiment, the flat antenna or the plurality of flat antennas in the transmission antenna apparatus are embodied as planar antennas. For example, planar flat antennas may be configured in a manner saving extreme amounts of space and may be integrated particularly easily into a patient couch of a magnetic resonance imaging device.

In developments of the transmission antenna apparatus, at least one of the flat antennas is embodied as a butterfly antenna, and/or at least one of the flat antennas is embodied as a loop antenna. In these developments (e.g., in combination), it is easy to generate a circular transmission magnetic field regularly used in magnetic resonance imaging devices. For example, a magnetic field may easily be generated by a loop antenna in a direction surrounded by a loop of the loop antenna. By contrast, a butterfly antenna makes it easy to generate a transmission magnetic field oriented in a direction pointing from a first wing of a butterfly shape of the butterfly antenna to a second wing of the butterfly shape of the butterfly antenna.

In the transmission antenna apparatus according to one or more of the present embodiments, at least one of the flat antennas is embodied as a butterfly antenna, and, at the same time, at least one of the flat antennas is embodied as a loop antenna. In one embodiment, the loop antenna is disposed such that the loop antenna encloses a spatial direction that points away from a contact region of the two wings of the butterfly shape of the butterfly antenna across the wings (e.g., perpendicular to the wings having a planar embodiment). As a result of this, one of two mutually perpendicular components of the transmission magnetic field may, in each case, be generated by the loop antenna and the butterfly antenna in the transmission antenna apparatus. The transmission antenna apparatus according to one or more of the present embodiments includes a feed apparatus configured to feed the loop antenna and the butterfly antenna. In one embodiment, the feed apparatus is configured to feed the loop antenna and butterfly antenna with a phase difference of 90°. Using the loop antenna and the butterfly antenna, transmission magnetic field components that are phase shifted by 90° and perpendicular to one another and, in combination, result in a circularly polarized transmission magnetic field may thus be generated.

The loop of the loop antenna may surround a crossing point of the butterfly shape of the butterfly antenna in planar directions of extent of this loop.

As an alternative or in addition to the aforementioned developments, at least one of the flat antennas of the transmission antenna apparatus is a loop antenna, and the transmission antenna apparatus also includes at least a first conductor piece and a second conductor piece that extend at least in part within the loop in planar directions of extent of the loop of the loop antenna. In the case of a planar loop antenna, a planar direction of extent of the loop may be the directions of extent along which the area surrounded by the loop of the loop antenna extends. To the extent that the loop antenna does not have a completely planar embodiment, the planar directions of extent may be all directions along which tangents on the loop of the loop antenna extend. Using the first conductor piece and the second conductor piece, transmission magnetic field components that extend in a planar direction of extent of the loop of the loop antenna may be generated. In this manner, a first and second conductor piece may form an alternative to the butterfly antenna. In a development of the transmission antenna apparatus, the transmission antenna apparatus includes a ground plane and/or a feed apparatus for feeding the conductor pieces. The first conductor piece and/or the second conductor piece is connected firstly to the ground plane and/or secondly to the feed apparatus for feeding the conductor pieces.

In a development of the transmission antenna apparatus, the transmission antenna apparatus includes at least a first flat antenna, a second flat antenna, and a third flat antenna each embodied as a loop antenna. In this development, the conductor pieces may be formed by two of the three loop antennas. In one embodiment, the loops of the first loop antenna, the second loop antenna, and the third loop antenna in the transmission antenna apparatus extend parallel (e.g., almost coplanar) to one another with the planar directions of extent thereof. In one embodiment, in the transmission antenna apparatus, the first loop antenna is disposed in the planar directions of extent of the loop of the second loop antenna on one side of the second loop antenna, and the third loop antenna is disposed in the direction of the planar direction of extent of the second loop antenna on the other side of the second loop antenna. In one embodiment, the loops of the first loop antenna and of the second loop antenna and/or the loops of the third loop antenna and of the second loop antenna suitably overlap in the direction of the planar directions of extent of the second loop antenna.

In one embodiment, in the transmission antenna apparatus, at least the loops of at least the first and the third loop antennas or at least the loops of at least the first loop antenna, the second loop antenna, and the third loop antenna have identical geometries.

In one embodiment, the transmission antenna apparatus includes a feed apparatus embodied for the feed in the opposite sense of the first and the third loop antennas.

For example, the current in the loop or loops of the first loop antenna and the third loop antenna may be suitably tuned as an additional degree of freedom compared to the current in the loop of the second loop antenna in order to set a range of ideal circular excitation. By way of example, in the transmission antenna apparatus according to one or more of the present embodiments, an asymmetric 180° coupler and an additional phase shifter may be provided for the current distribution thereof.

In a development of the transmission antenna apparatus, at least two of the loop antennas include one or more common conductor sections.

In one development of the transmission antenna apparatus, the first loop antenna and the third loop antenna, and/or the second loop antenna has a loop with a polygonal profile (e.g., a triangular or rectangular profile).

The magnetic resonance imaging device according to one or more of the present embodiments includes a transmission antenna apparatus, as described above. In one embodiment of the magnetic resonance imaging device, the magnetic resonance imaging device includes a patient couch including the transmission antenna apparatus.

DETAILED DESCRIPTION

Figure 1:
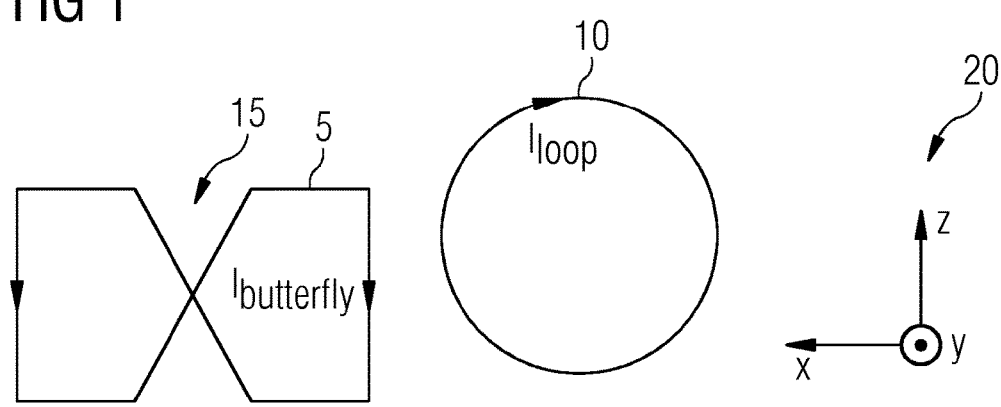
FIG. 1 shows a top view of a flat antenna embodied as a butterfly antenna and a flat antenna embodied as a loop antenna, of a transmission antenna apparatus according to one embodiment.

The flat antennas shown in FIG. 1 form flat antennas of a transmission antenna apparatus according to one or more of the present embodiments.

In accordance with FIG. 1, the flat antennas include both a flat antenna embodied as a butterfly antenna 5 and a loop antenna 10. Each of the butterfly antenna 5 and the loop antenna 10 has a flat and planar design (e.g., the antenna in each case extends along a plane). The plane of the butterfly antenna 5 and the plane of the loop antenna 10 extend parallel to one another. In one embodiment, the butterfly antenna 5 is in contact with the loop antenna 10 over an area (in FIG. 1, the loop antenna is shown offset in the plane of the loops in order to show the form of the flat antennas in detail), where the butterfly antenna 5 and the loop antenna 10 are electrically insulated from one another.

If a current $I_{butterfly}$ is applied to the butterfly antenna 5, this results in a magnetic field in the x-direction in the region of the crossing point 15 (see the coordinate system 20 in FIG. 1). By contrast, a current $I_{loop}$ is applied to the loop antenna 10, with this resulting in a magnetic field in the y-direction (e.g., perpendicular to the plane of the drawing) due to the form of the loop antenna.

The loop antenna 10 and the butterfly antenna 5 are actuated with a phase offset of 90° with respect to one another such that this results in a circular field in the xy-plane.

Figure 2:
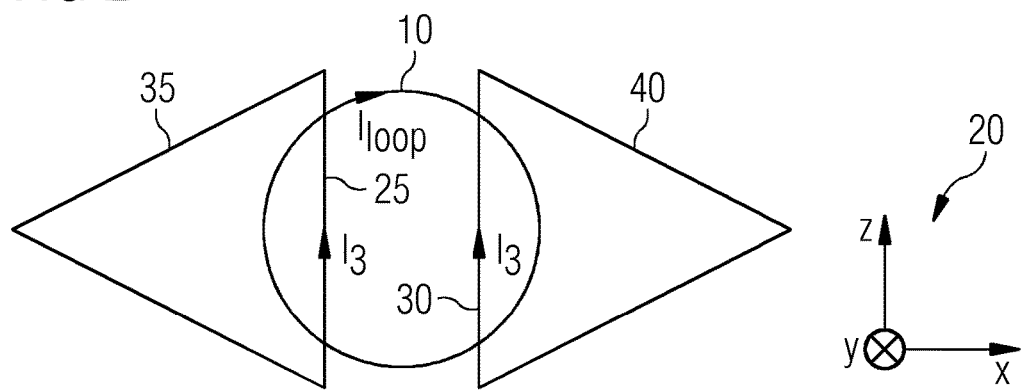
FIG. 2 schematically shows a top view of a further exemplary embodiment of flat antennas of a transmission antenna apparatus including three loop antennas.

In place of a butterfly antenna 5 including a crossing point 15 for generating a magnetic field in the x-direction, as depicted in FIG. 2, two mutually parallel conductor pieces 25, 30 that cause a magnetic field extending in the x-direction may be used. The two parallel conductor pieces 25, 30 are each part of a triangular loop antenna 35, 40 and form mutually parallel edges of the triangular shape of the loop antennas 35, 40. Therefore, in addition to the central loop antenna 10, two further loop antennas 35, 40 that are in place of the butterfly antenna 5 of the exemplary embodiment depicted in FIG. 1 are present. The distance between the triangular loop antennas determines the strength of the field generation in the region of the loop of the central loop antenna 10.

The predominant parts of the conductor pieces 25, 30 are respectively situated in planar directions of extent within the conductor loop of the loop antenna 10. The current $I_3$ is respectively applied in the opposite sense in each case to the triangular conductor loops of the loop antennas 35, 40 such that the current $I_3$ flows in the same direction through the parallel conductor pieces 25, 30. Therefore, the current flow through the two parallel conductor pieces 25, 30 results in a magnetic field oriented in the x-direction in the region of the center of the circle inscribed by the loop of the loop antenna 10.

Compared to the antenna configuration depicted in FIG. 1, the structure in accordance with FIG. 2 permits a more homogeneous field.

Figure 3:
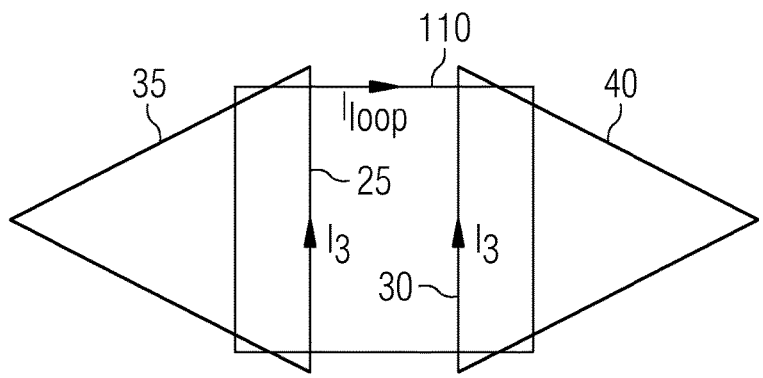
FIG. 3 schematically shows a top view of a further exemplary embodiment of flat antennas of a transmission antenna apparatus including three loop antennas with polygonal loops.

In place of a loop antenna 10 with a circular loop, as depicted in FIG. 3, a loop antenna 110 with a rectangular loop may be used. In one embodiment, two sides of the rectangular form of the loop antenna 110 extend parallel to the mutually parallel conductor pieces 25, 30 of the triangular loops of the loop antennas 35, 40. In this case, it is significantly easier to cascade the flat antennas.

Figure 4:
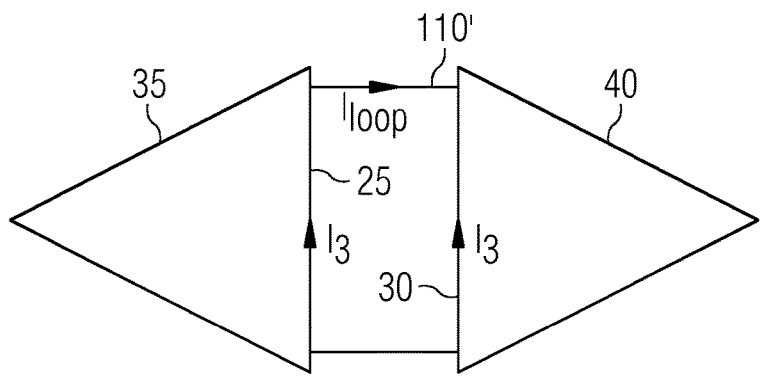
FIG. 4 schematically shows a top view of a further exemplary embodiment of flat antennas of a transmission antenna apparatus that includes common conductor sections.

With the flat antennas of the transmission antenna apparatus according to one or more of the present embodiments, depicted in FIG. 4, the parallel conductor pieces 25, 30 are both part of the triangular loop antennas 35, 40 and part of the central loop antenna 110' (otherwise, the transmission antenna apparatus in accordance with FIG. 4 corresponds to the transmission antenna apparatus in accordance with FIG. 3).

The region of ideal circular excitation may additionally be adjusted by a suitable ratio of current in the central loop antenna $I_{loop}$ and current in the triangular loop antenna $I_3$. In practice, this asymmetric current distribution may be realized by, for example, asymmetric 180° couplers and additional phase shifters.

Figure 5:
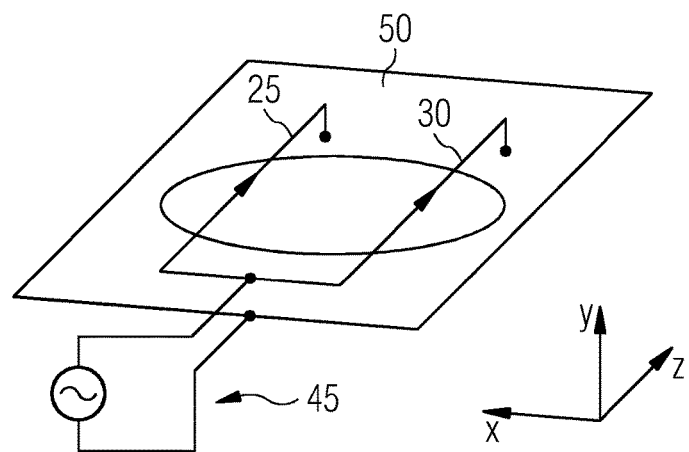
FIG. 5 schematically shows a perspective view of a combination of two conductor pieces with a loop antenna of a transmission antenna apparatus according to an embodiment.

Instead of the embodiment of the two conductor pieces 25, 30, as part of additional loop antennas 35, 40, the conductor pieces 25, 30 may also be embodied as parallel conductor pieces 25, 30, that, firstly, are together electrically connected to a feed 45 and are fed by the feed 45 and, secondly, are connected to a ground plane 50, by which the current may be returned to the feed (FIG. 5).

The distance between the conductor pieces 25, 30 determines the field generation in the region of the loop of the central loop antenna 10.

Figure 6:
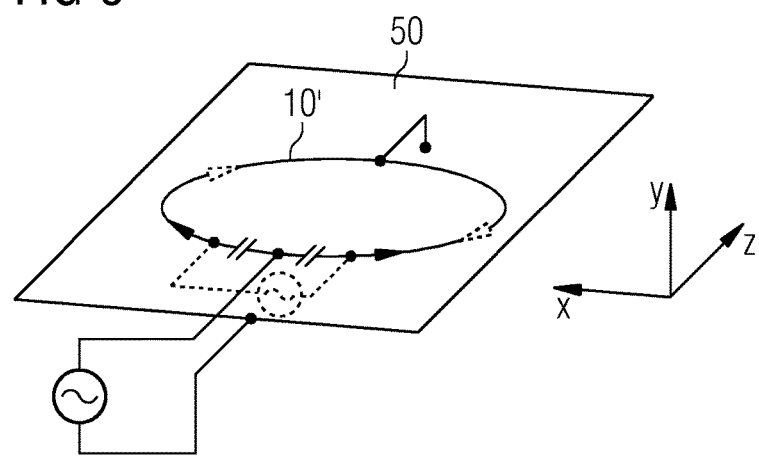
FIG. 6 schematically shows a perspective view of a further exemplary embodiment of a flat antenna of a transmission antenna apparatus in the form of a loop antenna.

In principle, a circular field may also be generated by a single loop antenna 10', which, for example, includes a circular area (e.g., the loop antenna in accordance with FIG. 6 may be excited on one side in common mode and differential mode and on the other side connected to a ground plane 50 for returning the current).

The differential mode excitation (dashed line) predominantly causes a field oriented in the y-direction, while the common mode excitation (full line) predominantly causes a field in the X-direction.

Figure 7:
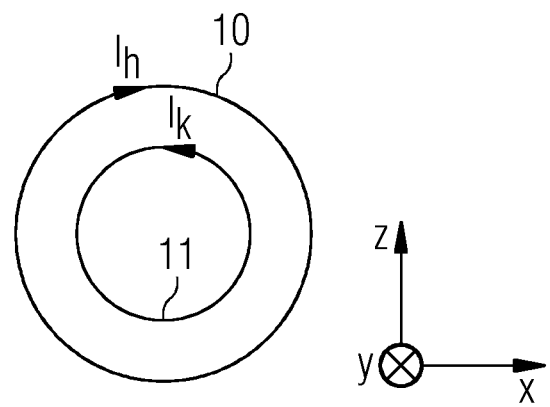
FIG. 7 schematically shows a top view of a further exemplary embodiment of flat antennas of a transmission antenna apparatus that are embodied as loop antennas with concentrically disposed loops.

By combining one of the loop antennas 10 that includes a circular area, as described above, with in each case a second loop antenna 11 that has a smaller diameter and through which a current $I_k$, which has a 180° phase offset in relation to the current $I_h$ from the loop antenna 10, flows, the drop-off of the magnetic field along the axis of coil symmetry (e.g., the normal to the loop plane situated centrally within the loop) may be reduced (FIG. 7). This may generate an almost ideal flat profile in the vicinity of the loop. If a plurality of loops that surround one another are used, the region of homogeneity of the loop antennas 10 may be broadened, as described above.

Figure 8:
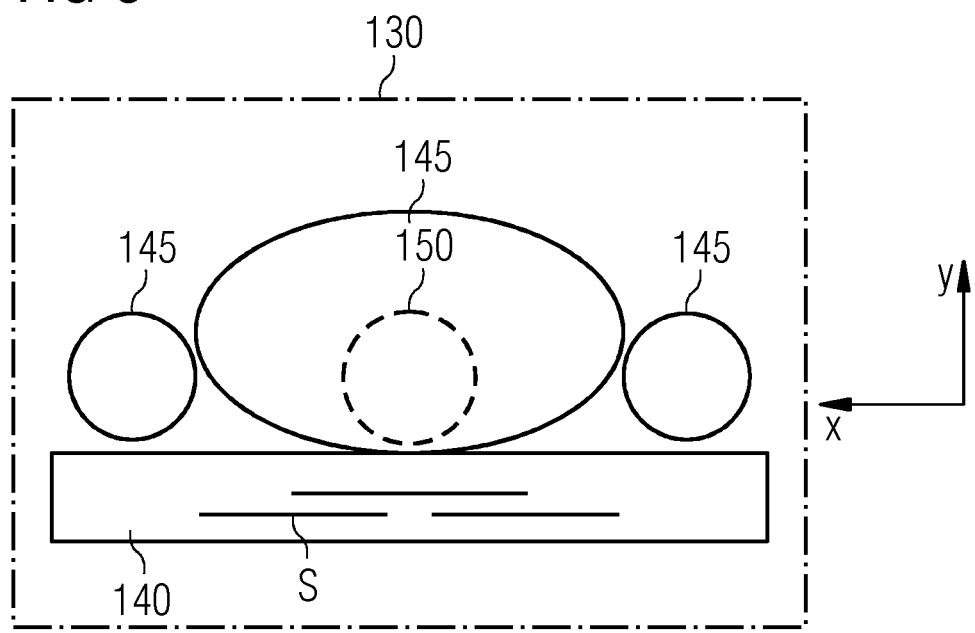
FIG. 8 schematically shows a cross section of one embodiment of a magnetic resonance imaging device with a transmission antenna apparatus with an arrangement of flat antennas.

The magnetic resonance imaging device 130 according to one or more of the present embodiments, depicted in FIG. 8, includes a patient couch 140. A transmission antenna apparatus S according to one or more of the present embodiments (as explained above based on FIGS. 1 to 7) is integrated into the patient couch 140. In one embodiment, with the planar directions of extent thereof, the transmission antenna apparatus S is oriented parallel to the flat sides of the patient couch 140. The patient couch 140 is provided to support a patient 145. The transmission antenna apparatus is embodied and disposed for applying a transmission magnetic field to the region of the spinal column 150.

By optimizing the geometry for planar circularly polarized antennas, these may also be used as transmission antennas in view of transmission field homogeneity and specific absorption rate (SAR) exposure.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A transmission antenna apparatus configured for emitting transmission magnetic fields in magnetic resonance imaging devices, the transmission antenna apparatus comprising:
   at least a first flat loop antenna, a second flat loop antenna, and a third flat loop antenna, the first flat loop antenna being spaced apart from and non-overlapping with the third flat loop antenna, at least a first conductor piece of the first flat loop antenna and a second conductor piece of the third flat loop antenna extending at least in part within the second flat loop antenna in planar directions of extent of the second flat loop antenna; and
   feed apparatuses configured for feeding the first conductor piece of the first flat loop antenna in an opposite direction to the second conductor piece of the third flat loop antenna.

2. The transmission antenna apparatus of claim 1, wherein at least one of the first flat loop antenna, the second flat loop antenna, and the third flat loop antenna is configured as a planar antenna.

3. The transmission antenna apparatus of claim 1, wherein at least one of the first flat loop antenna, the second flat loop antenna, and the third flat loop antenna is configured as a butterfly antenna.

4. The transmission antenna apparatus of claim 1, further comprising a ground plane, a feed apparatus, or a combination thereof for feeding the first conductor piece and the second conductor piece,
   wherein the first conductor piece, the second conductor piece, or the first conductor piece and the second conductor piece are connected to the ground plane, to the feed apparatus, or to the ground plane and the feed apparatus.

5. The transmission antenna apparatus of claim 1, wherein at least one antenna of the first flat loop antenna, the second flat loop antenna, and the third flat loop antenna is configured as a butterfly antenna, and
   wherein the loop of the second flat loop antenna surrounds a crossing point/contact point of the butterfly antenna in planar directions of extent of the loop.

6. The transmission antenna apparatus of claim 1, wherein the first loop antenna, the second loop antenna, and the third loop antenna extend parallel to one another with planar directions of extent thereof.

7. The transmission antenna apparatus of claim 6, wherein the first loop antenna, the second loop antenna, and the third loop antenna extend substantially coplanar to one another with the planar directions of extent thereof.

8. The transmission antenna apparatus of claim 1, wherein the loop of the first loop antenna is disposed in the planar directions of extent of the loop of the second loop antenna on one side of the loop of the second loop antenna, and the loop of the third loop antenna is disposed in the direction of the planar directions of extent of the second loop antenna on the other side of the loop of the second loop antenna.

9. The transmission antenna apparatus of claim 1, wherein the loops of the first loop antenna and of the second loop antenna, the loops of the third loop antenna and of the second loop antenna, or the loops of the first loop antenna and of the second loop antenna and the loops of the third loop antenna and of the second loop antenna overlap in directions of the planar directions of extent of the second loop antenna.

10. The transmission antenna apparatus of claim 1, wherein at least the loops of the first loop antenna and the third loop antenna or at least the loops of at least the first loop antenna, the second loop antenna, and the third loop antenna have an identical geometry.

11. The transmission antenna apparatus of claim 1, wherein at least the loops of two of the loop antennas comprise one or more common conductor sections.

12. The transmission antenna apparatus of claim 1, wherein one or more loop antennas have a loop with a polygonal profile.

13. The transmission antenna apparatus of claim 12, wherein the polygonal profile is a triangular profile.

14. The transmission antenna apparatus of claim 12, wherein the polygonal profile is a rectangular profile.

15. A magnetic resonance imaging device comprising:
  a transmission antenna apparatus configured for emitting transmission magnetic fields in magnetic resonance imaging devices, the transmission antenna apparatus comprising:
    at least a first flat loop antenna, a second flat loop antenna, and a third flat loop antenna, the first flat loop antenna being spaced apart from and non-overlapping with the third flat loop antenna, at least a first conductor piece of the first flat loop antenna and a second conductor piece of the third flat loop antenna extending at least in part within the second flat loop antenna in planar directions of extent of the second flat loop antenna; and
    feed apparatuses configured for feeding the first conductor piece of the first flat loop antenna in an opposite direction to the second conductor piece of the third flat loop antenna.

16. The magnetic resonance imaging device of claim 15, wherein at least one antenna of the first flat loop antenna, the second flat loop antenna, and the third flat loop antenna is configured as a planar antenna.

17. The magnetic resonance imaging device of claim 15, wherein at least one antenna of the first flat loop antenna, the second flat loop antenna, and the third flat loop antenna is configured as a butterfly antenna.

* * * * *